US012796427B2

(12) United States Patent
Su et al.

(10) Patent No.: US 12,796,427 B2
(45) Date of Patent: Nov. 10, 2026

(54) INTERCONNECT LAYER AND METHOD FOR MANUFACTURING THE SAME

(71) Applicant: Taiwan Semiconductor Manufacturing Company, Ltd., Hsinchu (TW)

(72) Inventors: Li-Ling Su, Hsinchu (TW); Ming-Hsien Lin, Hsinchu (TW); Hsin-Ping Chen, Hsinchu (TW); Shao-Kuan Lee, Hsinchu (TW); Cheng-Chin Lee, Hsinchu (TW); Yen-Ju Wu, Hsinchu (TW); Hsin-Yen Huang, Hsinchu (TW); Hsi-Wen Tien, Hsinchu (TW); Chih-Wei Lu, Hsinchu (TW); Chia-Chen Lee, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 496 days.

(21) Appl. No.: 18/334,802

(22) Filed: Jun. 14, 2023

(65) Prior Publication Data

US 2024/0420994 A1 Dec. 19, 2024

(51) Int. Cl.

*H10W 20/00* (2026.01)
*H10W 20/42* (2026.01)

(52) U.S. Cl.

CPC ....... *H10W 20/097* (2026.01); *H10W 20/076* (2026.01); *H10W 20/084* (2026.01); *H10W 20/42* (2026.01)

(58) Field of Classification Search

CPC ............... H01L 23/5286; H01L 21/768; H01L 23/5226; H10D 89/10; H10W 20/42; H10W 20/077; H10W 20/47; H10W 20/48

See application file for complete search history.

(56) References Cited

U.S. PATENT DOCUMENTS

2022/0352073 A1* 11/2022 Peng ................. H01L 23/53228

* cited by examiner

*Primary Examiner* — Thanhha S Pham

(74) *Attorney, Agent, or Firm* — Birch, Stewart, Kolasch & Birch, LLP

(57) ABSTRACT

A semiconductor device includes a substrate, a heat dissipation dielectric layer, a conductive interconnect structure, and a blocking dielectric layer. The heat dissipation dielectric layer is disposed on the substrate and has a thermal conductivity greater than 10 W/mK. The conductive interconnect structure is disposed in the heat dissipation dielectric layer. The blocking dielectric layer is disposed in the heat dissipation dielectric layer to isolate the conductive interconnect structure from the heat dissipation dielectric layer.

20 Claims, 7 Drawing Sheets

INTERCONNECT LAYER AND METHOD FOR MANUFACTURING THE SAME

BACKGROUND

The integration density of various electronic components, such as transistors, diodes, resistors, capacitors, etc., is being continuously improved in integrated circuit industry by continual reduction in minimum feature sizes. As the feature sizes are reduced, the distance between metal features is continually reduced, causing an increase in parasitic capacitance, which leads to larger resistance-capacitance (RC) delay for an integrated chip. To reduce the parasitic capacitance, materials having low dielectric constant (k) values are used. However, such materials having low k values might impede thermal dissipation, and thus, cause thermal-related reliability issues and performance deterioration.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
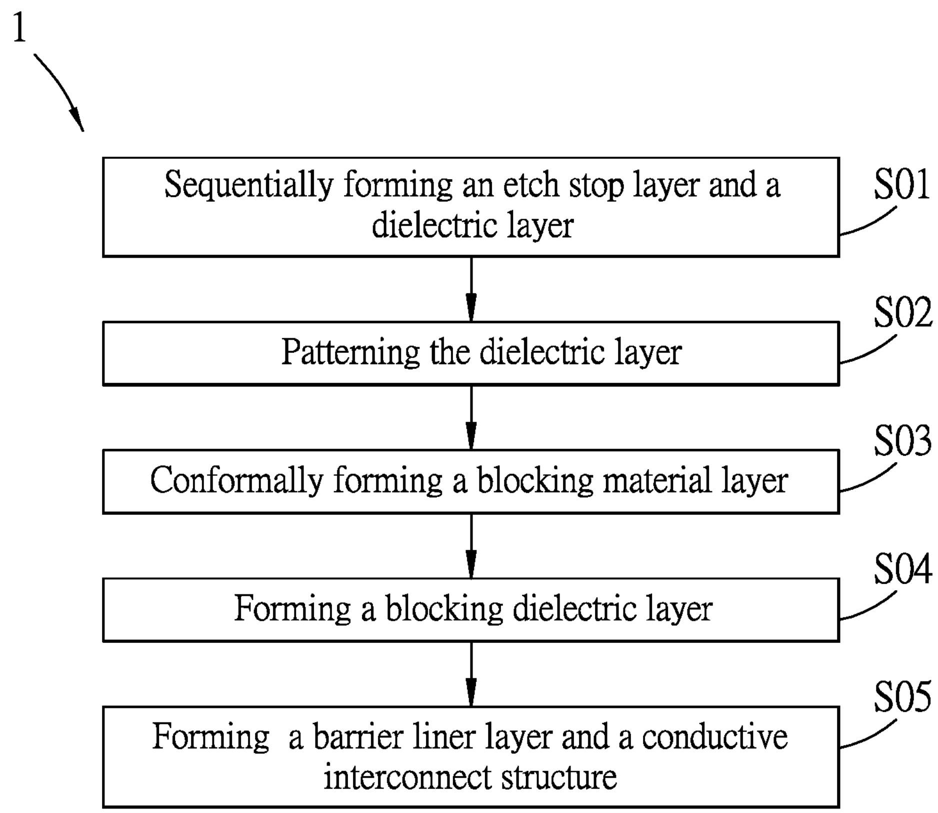
FIG. 1 is a flow diagram illustrating a method for manufacturing a semiconductor device in accordance with some embodiments, in which a dual damascene process is used.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "downwardly," "upwardly," "upper," "lower," "over," "below," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For the purposes of this specification and appended claims, unless otherwise indicated, all numbers expressing amounts, sizes, dimensions, proportions, shapes, formulations, parameters, percentages, quantities, characteristics, and other numerical values used in the specification and claims, are to be understood as being modified in all instances by the term "about" even though the term "about" may not expressly appear with the value, amount or range. Accordingly, unless indicated to the contrary, the numerical parameters set forth in the following specification and attached claims are not and need not be exact, but may be approximate and/or larger or smaller as desired, reflecting tolerances, conversion factors, rounding off, measurement error and the like, and other factors known to those of skill in the art depending on the desired properties sought to be obtained by the presently disclosed subject matter. For example, the term "about," when referring to a value can be meant to encompass variations of, in some aspects ±10%, in some aspects ±5%, in some aspects ±2.5%, in some aspects ±1%, in some aspects ±0.5%, and in some aspects ±0.1% from the specified amount, as such variations are appropriate to perform the disclosed methods or employ the disclosed compositions.

As feature sizes in semiconductor devices are continuously reduced in integrated circuit industry, thermal management of the semiconductor devices becomes an important issue for boosting performances of the semiconductor devices. Currently, materials having low dielectric constant (k) values are used to reduce a parasitic capacitance and a resistance-capacitance (RC) time delay. However, such materials having low k values may impede thermal dissipation, and thus cause thermal-related reliability issues and performance deterioration. When the materials having low k values are used as inter-metal dielectric materials in semiconductor devices, heat produced from, for example, but not limited to, working devices and/or conductive lines will degrade the performance of the semiconductor devices if the heat cannot be dissipated efficiently. Therefore, the present disclosure is directed to a semiconductor device including an interconnect layer having improved thermal dissipation. Such interconnect layer can be applied on a front side, a back side, or both sides of a semiconductor substrate. In addition, a single damascene process or a dual damascene process can be used for manufacturing the interconnect layer.

FIG. 1 is a flow diagram illustrating a method 1 for manufacturing a semiconductor device (for example, the semiconductor device 100 shown in FIGS. 6 and 10) in accordance with some embodiments, in which a dual damascene process is used for manufacturing an interconnect structure of the semiconductor device 100. FIGS. 2 to 10 illustrate schematic views of some intermediate stages of the method 1 in accordance with some embodiments. Additional steps can be provided before, after or during the method 1, and some of the steps described herein may be replaced by other steps or be eliminated. Similarly, further additional features may be present in the semiconductor device 100, and/or features present may be replaced or eliminated in additional embodiments.

Figure 2:
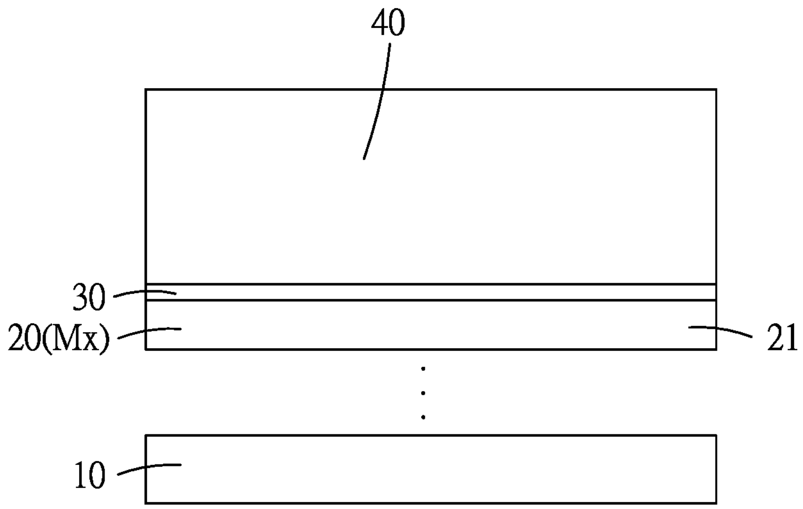
FIGS. 2 to 10 illustrate schematic views of some intermediate stages of the method depicted in FIG. 1 in accordance with some embodiments.

Referring to FIG. 1 and the example illustrated in FIG. 2, the method 1 begins at step S01, where an etch stop layer 30 and a dielectric layer 40 are formed sequentially on a conductive line layer 20 (for example, a metal line layer ($M_x$)) disposed on a semiconductor substrate 10.

In some embodiments, the semiconductor substrate 10 may include, for example, but not limited to, an elemental semiconductor or a compound semiconductor. In some embodiments, the elemental semiconductor includes a single species of atoms, such as silicon (Si) or germanium (Ge) in column XIV of the periodic table, and may be in crystal, polycrystalline, or an amorphous form. Other suitable materials are within the contemplated scope of the present disclosure. In some embodiments, the compound semiconductor includes two or more elements, and examples thereof may include, but not limited to, silicon carbide (SiC), gallium arsenide (GaAs), gallium phosphide (GaP), indium phosphide (InP), indium arsenide (InAs), indium antimonide (InSb), silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and gallium indium arsenide phosphide (GaInAsP). Other suitable materials are within the contemplated scope of the present disclosure. The compound semiconductor may have a gradient feature in which the compositional ratio thereof changes from one location to another location therein. The compound semiconductor may be formed over a silicon substrate. The compound semiconductor may be strained. In some embodiments, the semiconductor substrate may include a multilayer compound semiconductor structure. In some embodiments, the semiconductor substrate may be a semiconductor on insulator (SOI) (e.g., silicon germanium on insulator (SGOI)). Generally, an SOI substrate includes a layer of a semiconductor material such as epitaxial silicon, germanium, silicon germanium, or combinations thereof. Other suitable materials are within the contemplated scope of the present disclosure. The SOI substrate may be doped with a P-type dopant, for example, but not limited to, boron (Br), aluminum (Al), or gallium (Ga). Other suitable materials are within the contemplated scope of the present disclosure. Alternatively, the SOI substrate may be doped with an N-type dopant, for example, but not limited to, nitrogen (N), phosphorous (P), or arsenic (As). Other suitable materials are within the contemplated scope of the present disclosure. In some embodiments, the semiconductor substrate may further include various active regions, for example, the active regions configured for an N-type metal oxide semiconductor transistor device (NMOS) or the active regions configured for a P-type metal oxide semiconductor transistor device (PMOS).

In some embodiments, the conductive line layer 20 may include a dielectric layer (not shown) disposed on the semiconductor layer 10, and a plurality of conductive lines (for example, metal lines) 21 disposed in the dielectric layer and spaced apart from each other. One of the conductive lines 21 is shown in FIG. 2. In some embodiments, the dielectric layer may be made of a dielectric material, for example, but not limited to, silicon oxide (SiOx), silicon carbide (SiCx), silicon carbonitride (SiCxNy), silicon carboxide (SiCxOy), hydrogenated silicon oxycarbide (SiOxCyHz), or combinations thereof. Other suitable dielectric materials are within the contemplated scope of the present disclosure. In some embodiments, the conductive lines 21 may be made of a conductive material, for example, but not limited to, copper (Cu), aluminum (Al), gold (Au), silver (Ag), tungsten (W), cobalt (Co), ruthenium (Ru), iridium (Ir), platinum (Pt), nickel (Ni), palladium (Pd), osmium (Os), molybdenum (Mo), titanium (Ti), ruthenium (Ru), scandium (Sc), rhodium (Rh), carbon (C), or the like, or combinations thereof. Other suitable conductive materials are within the contemplated scope of the present disclosure. The conductive lines 21 may be formed by a single damascene process as is known to those skilled in the art of semiconductor fabrication. In some embodiments, the conductive line layer 20 may be formed by the steps described in the following paragraphs.

The dielectric layer is formed on the semiconductor substrate 10 using the dielectric material by a suitable deposition process, for example, but not limited to, a chemical vapor deposition (CVD) process, an atomic layer deposition (ALD) process, a spin-on-dielectric (SOD) process, or the like, or combination thereof. Other suitable deposition processes are within the contemplated scope of the present disclosure. The dielectric layer formed on the semiconductor substrate 10 is patterned by a suitable etching process (for example, a dry etching process, a wet etching etching process, or a combination thereof) through a pattern of openings formed in a patterned mask layer (not shown) so as to form a plurality of trenches (not shown) spaced part from each other. The conductive material is filled into the trenches by a suitable deposition process as is known to those skilled in the art of semiconductor fabrication, for example, but not limited to, selective or non-selective physical vapor deposition (PVD), selective or non-selective CVD, selective or non-selective plasma-enhanced CVD (PECVD), selective or non-selective ALD, selective or non-selective plasma-enhanced ALD (PEALD), electroless deposition (ELD), electro-chemical plating (ECP), or the like, and a planarization treatment (e.g., chemical mechanic planarization (CMP)) is then performed to remove excess of the conductive material over the dielectric layer so as to form the conductive line layer 20 including the conductive lines 21 disposed in the dielectric layer.

In some embodiments, the etch stop layer 30 is formed on the conductive line layer 20 by a suitable deposition process as is known in the art of semiconductor fabrication, such as PVD, CVD, ALD, PEALD, thermal ALD, PECVD, or the like. Other suitable deposition techniques are within the contemplated scope of the present disclosure. In some embodiments, the etch stop layer 30 may include silicon nitride, silicon carbonitride, silicon oxide, silicon oxynitride, silicon oxycarbon nitride, silicon carbide, silicon oxycarbide, metal (for example, but not limited to, ruthenium (Ru), tungsten (W), titanium (Ti), aluminum (Al), cobalt (Co), or the like, or combinations thereof), metal oxide (for example, but not limited to, aluminum oxide (AlOx), or the like), metal oxynitride (for example, but not limited to, aluminum oxynitride (AlOxNy), or the like). Other suitable materials are within the contemplated scope of the present disclosure. In some embodiments, two or more of the etch stop layers 30 may be formed on the conductive line layer 20 depending on practical requirements, and each of the etch stop layers 30 may be independently selected from the materials for the etch stop layer 30 as described above. In some embodiments, the etch stop layer 30 has a thickness ranging from about 10 nanometers (nm) to about 500 nm. If the thickness of the etch stop layer 30 is less than 10 nm, the etch stop layer 30 cannot be used as an effective etch stop layer to stop a subsequent etching process.

In some embodiments, the dielectric layer 40 may be formed on the etch stop layer 30 by a suitable deposition process as is known in the art of semiconductor fabrication, such as CVD, ALD, PEALD, thermal ALD, PECVD, or the like. Other suitable deposition techniques are within the contemplated scope of the present disclosure. In some embodiments, the dielectric layer 40 include a high thermal conductive dielectric material. In some embodiments, the high thermal conductive dielectric material for the dielectric layer 40 has a thermal conductivity greater than about 10 W/mK. In some embodiments, the high thermal conductive dielectric material for the dielectric layer 40 has a thermal conductivity greater than about 100 W/mK. In some embodiments, the high thermal conductive dielectric material for the dielectric layer 40 may include, for example, but not limited to, boron arsenide (BAs), beryllium oxide (BeOx), hexagonal boron nitride (h-BN), diamond, graphene, graphite, silicon nitride (SiN), silicon carbide (SiC), aluminum oxide (AlOx), aluminum nitride (AlN), magnesium oxide (MgO), silicon oxide (SiOx), sapphire, zirconium oxide (ZrOx), bismuth oxide (BiOx), titanium oxide (TiOx), gallium oxide (GaOx), gallium arsenide (GaAs), gallium nitride (GaN), β-carbon nitride (β-$C_3N_4$), indium antimonide (InSb), boron carbide ($B_4C$), hafnium oxide (HfO), or combinations thereof. Other suitable high thermal conductive dielectric materials are within the contemplated scope of the present disclosure. In some embodiments, one or more layers of the high thermal conductive dielectric material independently selected from the high thermal conductive dielectric material described above can be used for forming the dielectric layer 40.

Figure 3:
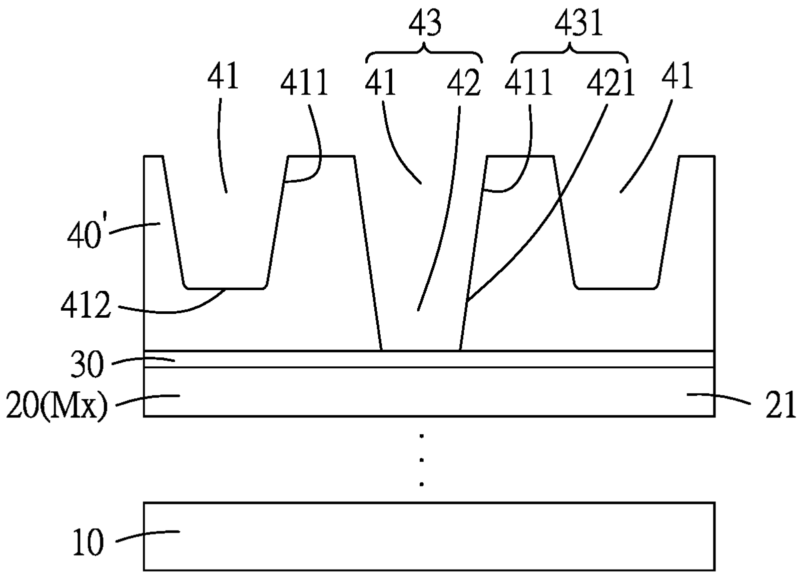

Referring to FIG. 1 and the example illustrated in FIG. 3, the method 1 proceeds to step S02, where the dielectric layer 40 is patterned. The dielectric layer 40 of the structure shown in FIG. 2 is patterned by one or more etching processes (for example, but not limited to, a dry etching process, a wet etching process, or a combination thereof) through a pattern of openings formed in a patterned mask layer (not shown) to obtain a patterned dielectric layer 40', which is formed with a plurality of first recesses (for example, a plurality of trenches) 41 and a second recess (for example, a via opening) 42 so as to expose a portion of the etch stop layer 30 through the second recess 42 and a corresponding one of the first recesses 41. In some embodiments, the second recess 42 is first formed, followed by forming the first recesses 41. The first recesses 41 are recessed downwardly from an upper surface of the patterned dielectric layer 40' opposite to the etch stop layer 30, and the second recess 42 is disposed below and is in spatial communication with a corresponding one of the first recesses 41, such that an integrated recess 43 is formed for the portion of the etch stop layer 30 to be exposed therethrough. The second recess 42 has a sidewall 421 extending upwardly from the etch stop layer 30. Each of the first recesses 41 has a sidewall 411 extending downwardly from the upper surface of the patterned dielectric layer 40'. The sidewall 421 of the second recess 42 is connected to the sidewall 411 of the corresponding one of the first recesses 41 to form a sidewall 431 of the integrated recess 43 which extends in a direction from the upper surface of the patterned dielectric layer 40' to the etch stop layer 30 so as to expose the portion of the etch stop layer 30 therethrough. Each of the first recesses 41 other than the corresponding one of the first recesses 41 in spatial communication with the second recess 42 further has a bottom 412 at which the sidewall 411 extends to terminate.

In some embodiments, the patterned mask layer for patterning the dielectric layer 40 of the structure shown in FIG. 2 may be formed by the steps described in the following paragraph.

A mask layer (for example, a hard mask layer) is deposited on the dielectric layer 40 of the structure shown in FIG. 2. Examples of a material suitable for forming the mask layer include, for example, but not limited to, silicon oxide, silicon nitride, silicon carbide, silicon oxycarbide, silicon oxynitride, silicon carbonitride, silicon oxycarbonitride, tungsten nitride, tungsten carbide, titanium nitride, zirconium oxide, aluminum oxide, yttrium oxide, aluminum oxynitride, hafnium oxide, hafnium zirconium oxide, hafnium silicon oxide, hafnium silicon oxynitride, zirconium silicon oxide, hafnium zirconium silicon oxide, hafnium aluminum oxide, hafnium aluminum nitride, zirconium aluminum oxide, ytterbium oxide, and combinations thereof. Other suitable materials are within the contemplated scope of the present disclosure. The mask layer may be formed on the dielectric layer 40 by a suitable deposition process as is known in the art of semiconductor fabrication, such as PVD, CVD, ALD, PEALD, thermal ALD, PECVD, or the like. Other suitable techniques are within the contemplated scope of the present disclosure. A photoresist layer (not shown) is then formed on the mask layer by a suitable fabrication technique known to those skilled in the art of semiconductor fabrication, for example, but not limited to, a spin-on technique. Other suitable techniques are within the contemplated scope of the present disclosure. The photoresist layer is then patterned using a suitable photolithography technique to form a pattern of recesses. For example, the photoresist layer is exposed to light for patterning, followed by developing to form the pattern of the recesses. The pattern of the recesses formed in the photoresist layer is transferred to the mask layer using one or more etching processes, for example, but not limited to, a wet etching process, a dry etching process, a reactive ion etching process, a neutral beam etching process, or the like. After the pattern of the recesses is transferred to the mask layer, the photoresist layer may be removed by, for example, but not limited to, an ashing process, such that the patterned mask layer is formed on the dielectric layer 40. One or more of the patterned mask layers may be used for patterning the dielectric layer 40.

Figure 4:
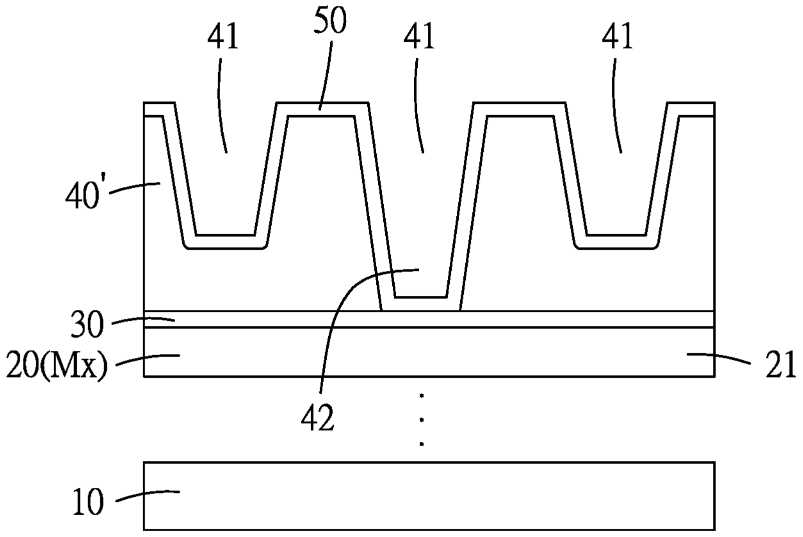

Referring to FIG. 1 and the example illustrated in FIG. 4, the method 1 proceeds to step S03, where a blocking material layer 50 is conformally formed. In some embodiments, the blocking material layer 50 may be conformally formed on the structure shown in FIG. 3 to cover the patterned dielectric layer 40' and the portion of the etch stop layer 30. In some embodiments, conformal formation of the blocking material layer 50 may be performed by a suitable deposition process as is known in the art of semiconductor fabrication, such as PVD, CVD, ALD, PEALD, thermal ALD, PECVD, or the like. Other suitable deposition techniques are within the contemplated scope of the present disclosure. In some embodiments, the blocking material layer 50 has a thickness ranging from about 0.1 nm to about 500.0 nm. In some embodiments, the blocking material layer 50 may include a blocking dielectric material, for example, but not limited to, boron arsenide (BAs), beryllium oxide (BeOx), hexagonal boron nitride (h-BN), diamond, graphene, graphite, silicon nitride (SiN), silicon carbide (SiC), aluminum oxide (AlOx), aluminum nitride (AlN), magnesium oxide (MgO), silicon oxide (SiOx), sapphire, zirconium oxide (ZrOx), bismuth oxide (BiOx), titanium oxide (TiOx), gallium oxide (GaOx), gallium arsenide (GaAs), gallium nitride (GaN), β-carbon nitride (β-$C_3N_4$), indium antimonide (InSb), boron carbide ($B_4C$), hafnium oxide (HfO), silicon carbonitride (SiCN), aluminum oxynitride (AlOxNy), or combinations thereof. Other suitable blocking dielectric materials are within the contemplated scope of the present disclosure. In some embodiments, the blocking dielectric material for forming the blocking material layer 50 may be a dielectric material which includes elements the same as those of a dielectric material for the high thermal conductive dielectric material that is used for forming the dielectric layer 40, and the contents of the elements included the dielectric material for the blocking dielectric material are different from those of the elements included the dielectric material for the high thermal conductive dielectric material, so as to permit both of the dielectric materials to have different properties, i.e., one with a high thermal conductive property (i.e., a heat dissipation property) and the other one with a current blocking property. In some embodiments, one or more layers of the blocking dielectric material may be used to form the blocking material layer 50.

Figure 5:
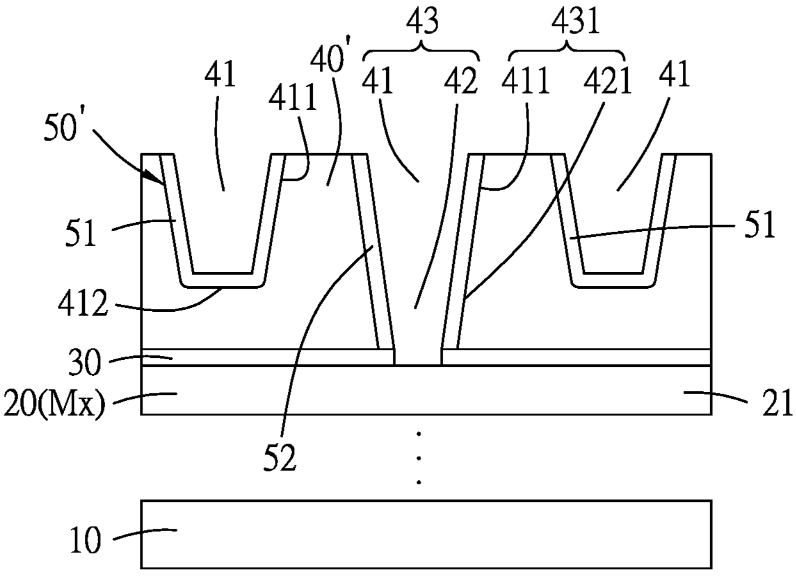

Referring to FIG. 1 and the example illustrated in FIG. 5, the method 1 proceeds to step S04, where a blocking dielectric layer 50' is formed. Portions of the blocking material layer 50, which are disposed on the portion of the etch stop layer 30 and the upper surface of the patterned dielectric layer 40', and the portion of the etch stop layer 30 of the structure shown in FIG. 4 are removed selectively by one or more etching processes (for example, but not limited to, a dry etching process (for example, a plasma dry etching process), a wet etching process (for example, a chemical wet etching process), or a combination thereof) to form the blocking dielectric layer 50' and to expose a portion of a corresponding one of the conductive lines 21 of the conductive line layer 20 through the integrated recess 43. The blocking dielectric layer 50' includes a plurality of first blocking dielectric portions 51 and a second blocking dielectric portion 52. Each of the first blocking dielectric portions 51 is disposed on the sidewall 411 and the bottom 412 of a corresponding one of the first recesses 41. The second blocking dielectric portion 52 is disposed on the sidewall 431 of the integrated recess 43 (i.e., on the sidewall 421 of the second recess 42 and the sidewall 411 of the corresponding one of the first recesses 41).

Figure 6:
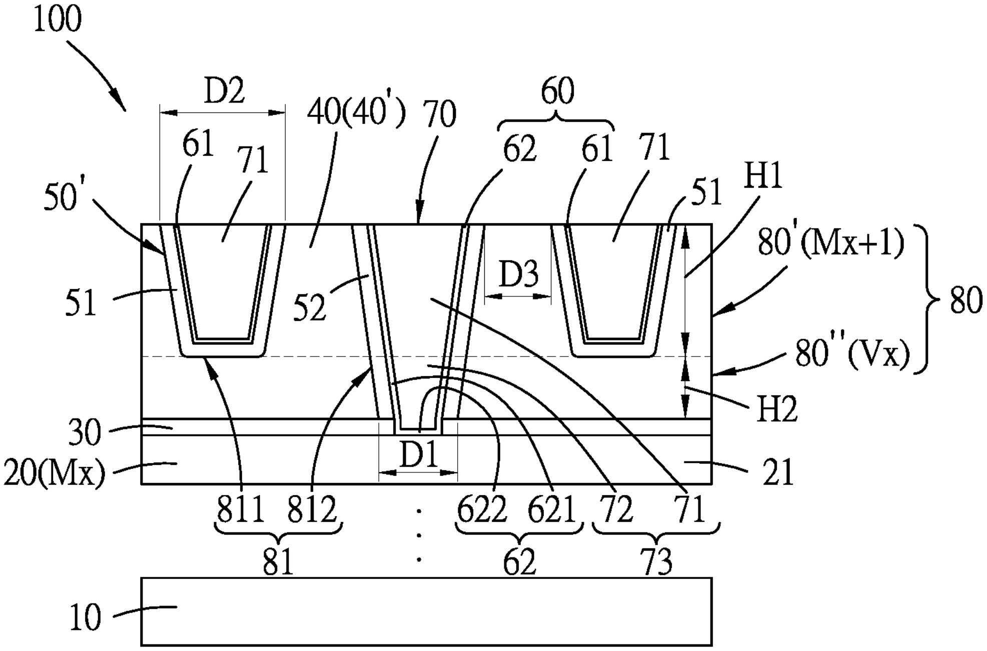

Referring to FIG. 1 and the example illustrated in FIG. 6, the method 1 proceeds to step S05, where a barrier liner layer 60 and a conductive interconnect structure 70 are formed. In some embodiments, the barrier liner layer 60 includes a plurality of first barrier liner portions 61 and a second barrier liner portion 62. Each of the first barrier liner portions 61 is conformally disposed on a corresponding one of the first blocking dielectric portions 51. The second barrier liner portion 62 includes a wall part 621 conformally disposed on the second blocking dielectric portion 52 and extending downwardly through the etch stop layer 30 to terminate at the corresponding one of the conductive lines 21 of the conductive line layer 20, and a bottom part 622 disposed on the corresponding one of the conductive lines 21 of the conductive line layer 20 and connected to the wall part 621. In some embodiments, the barrier liner layer 60 may be made of a barrier liner material, which may include metal (for example, but not limited to, tantalum (Ta), aluminum (Al), titanium (Ti), cobalt (Co), niobium (Nb), lead (Pb), platinum (Pt), nickel (Ni), scandium (Sc), ruthenium (Rn), molybdenum (Mo), tungsten (W), iridium (Ir), rhodium (Rh), or the like), metal oxide (for example, but not limited to, aluminum oxide (AlOx), or the like), metal nitride (for example, but not limited to, tantalum nitride (TaN), titanium nitride (TiN), or the like), carbon (C), silicon (Si), or combinations thereof. In some embodiments, one or more layers of the barrier liner material independently selected from the barrier liner material described above can be used for forming the barrier liner layer 60. In some embodiments, the barrier liner layer 60 has a thickness ranging from about 0.1 nm to about 100.0 nm. In some embodiments, the barrier liner layer 60 may not be formed, such that the conductive interconnect structure 70 is disposed to be in contact with the blocking dielectric layer 50'.

In some embodiments, the conductive interconnect structure 70 includes a plurality of first conductive features (for example, conductive lines) 71 spaced part from each other and a second conductive feature (for example, a conductive via) 72 disposed below and connected to a corresponding one of the first conductive features 71, so as to electrically interconnect the corresponding one of the first conductive feature 71 and the corresponding one of the conductive lines 21 of the conductive line layer 20. The second conductive feature 72 cooperates with the corresponding one of the first conductive features 71 to form an integrated conductive feature 73. In some embodiments, the conductive interconnect structure 70 may be made of a conductive material, for example, but not limited to, copper (Cu), aluminum (Al), gold (Au), silver (Ag), tungsten (W), cobalt (Co), ruthenium (Ru), iridium (Ir), platinum (Pt), nickel (Ni), palladium (Pd), osmium (Os), molybdenum (Mo), titanium (Ti), ruthenium (Ru), scandium (Sc), rhodium (Rh), carbon (C), or the like, or combinations thereof. Other suitable conductive materials are within the contemplated scope of the present disclosure.

In some embodiments, one or more layers of the barrier liner material are conformally formed on the structure shown in FIG. 5 by a suitable deposition process as is known in the art of semiconductor fabrication, such as PVD, CVD, ALD, PEALD, thermal ALD, PECVD, or the like. Other suitable deposition techniques are within the contemplated scope of the present disclosure. The conductive material is then filled into the integrated recess 43 and the first recesses 41 by a suitable deposition process as is known to those skilled in the art of semiconductor fabrication, for example, selective or non-selective PVD, selective or non-selective CVD, selective or non-selective PECVD, selective or non-selective ALD, selective or non-selective PEALD, electroless deposition (ELD), electro-chemical plating (ECP), or the like, and a planarization treatment (e.g., CMP) is then performed to remove excess of the barrier liner material and excess of the conductive material over the patterned dielectric layer 40' so as to form the barrier liner layer 60 and the conductive interconnect structure 70 at the same time. The semiconductor device 100 shown in FIG. 6 is obtained accordingly.

Referring to the example illustrated in FIG. 6, the semiconductor device 100 includes an interconnect layer 80 disposed on the conductive line layer 20. The interconnect layer 80 includes a first interconnect sub-layer 80' (for example, a conductive line layer ($M_{x+1}$)) and a second interconnect sub-layer 80" (for example, a conductive via layer ($V_x$)) disposed between the conductive line layer 20 and the first interconnect sub-layer 80'. In addition, the interconnect layer 80 includes the dielectric layer 40, the conductive interconnect structure 70 disposed in the dielectric layer 40, the blocking dielectric layer 50' disposed in the dielectric layer 40 to isolate the conductive interconnect structure 70 from the dielectric layer 40, and the barrier liner layer 60 disposed to separate the conductive interconnect structure 70 from the blocking dielectric layer 50'.

The first interconnect sub-layer 80' includes: an upper portion of the dielectric layer 40; the first conductive features 71 disposed in the upper portion of the dielectric layer 40; the first blocking dielectric portions 51, each of which is disposed in the upper portion of the dielectric layer 40 to isolate a corresponding one of the first conductive features 71 from the upper portion of the dielectric layer 40; an upper part of the second blocking dielectric portion 52 disposed to isolate a corresponding one of the first conductive features 71 from the upper portion of the dielectric layer 40; the first barrier liner portions 61 disposed to separate a corresponding one of the first conductive features 71 from a corresponding one of the first blocking dielectric portions 51; and an upper part of the second barrier liner portion 62 disposed to separate a corresponding one of the first conductive features 71 from the upper part of the second blocking dielectric portion 52.

The second interconnect sub-layer 80'' includes: a lower portion of the dielectric layer 40; the second conductive feature 72 disposed in the lower portion of the dielectric layer 40; a lower part of the second blocking dielectric portion 52 disposed to isolate the second conductive feature 72 from the lower portion of the dielectric layer 40; and a lower part of the second barrier liner portion 62 disposed to separate the second conductive features 72 from the lower part of the second blocking dielectric portion 52.

Since the dielectric layer 40 is made of the high thermal conductive dielectric material having a thermal conductivity greater than about 10 W/mK, and serves as a heat dissipation layer, the heat produced from, for example, but not limited to, the conductive interconnect structure 70 can be dissipated efficiently. In addition, the blocking dielectric layer 50' is disposed in the dielectric layer 40 to isolate the conductive interconnect structure 70 from the dielectric layer 40 and to isolate the first conductive features 71 from one another. Therefore, current leakage among the first conductive features 71 through the dielectric layer 40 can be avoided. In some embodiments, the blocking dielectric layer 50' has a thickness ranging from about 0.1 nm to about 500 nm. If the thickness of the blocking dielectric layer 50' is less than 0.1 nm, the current leakage among the first conductive features 71 through the dielectric layer 40 cannot be avoided effectively.

In addition, the interconnect layer 80 includes an interconnect structure 81, which includes a plurality of first features 811 (for example, a plurality of line features) spaced apart from each other and a second feature 812 (for example, a via feature) connected to a corresponding one of the first features 811. The first features 811 are disposed in the upper portion of the dielectric layer 40, and the second feature 812 is disposed in the lower portion of the dielectric layer 40. The second feature 812 includes the second conductive feature 72, the lower part of the second barrier liner portion 62 covering a bottom and a lateral surface of the second conductive feature 72, and the lower part of the second blocking dielectric portion 52 laterally covering the lower part of the second barrier liner portion 62. In some embodiments, the second feature 812 has a horizontal dimension (D1) ranging from about 10 nm to about 1000 nm. The corresponding one of the first features 811 connected to the second feature 812 includes a corresponding one of the first conductive features 71 connected to the second conductive feature 72, the upper part of the second barrier liner portion 62 laterally covering the corresponding one of the first conductive features 71, and the upper part of the second blocking dielectric portion 52 laterally covering the upper part of the second barrier liner portion 62. Each of the first features 811, other than the corresponding one of the first features 811 connected to the second feature 812, includes a corresponding one of the first conductive features 71, a corresponding one of the first barrier liner portions 61 covering a bottom and a lateral surface of the corresponding one of the first conductive features 71, and a corresponding one of the first blocking dielectric portions 51 disposed to be separated from the corresponding one of the first conductive features 71 by the corresponding one of the first barrier liner portions 61. Each of the first features 811 has a horizontal dimension (D2) ranging from about 10 nm to about 1000 nm. Two adjacent ones of the first features 811 are spaced apart from each other by a distance (D3) ranging from about 10 nm to about 1000 nm. In some embodiments, the first features 811 have a height (H1) ranging from about 10 nm to about 3000 nm. In some embodiments, the second features 812 have a height (H2) ranging from about 10 nm to about 3000 nm.

Figure 7:
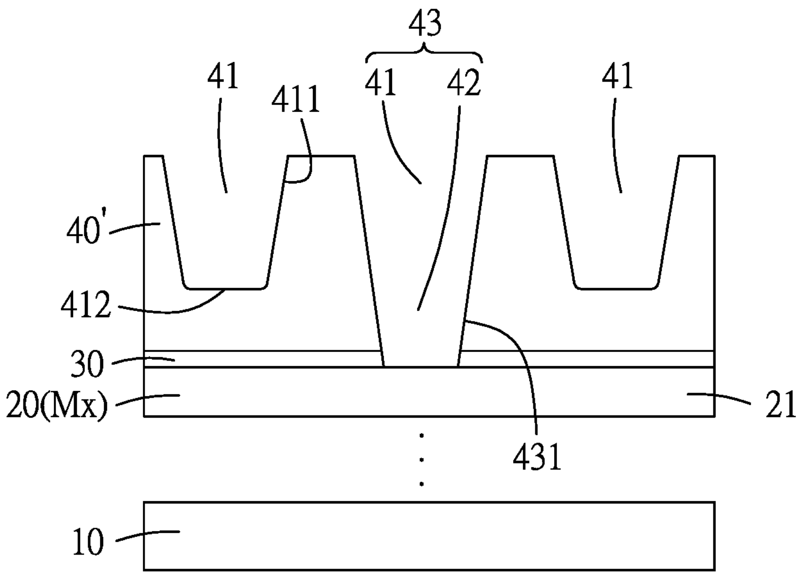
Figure 8:
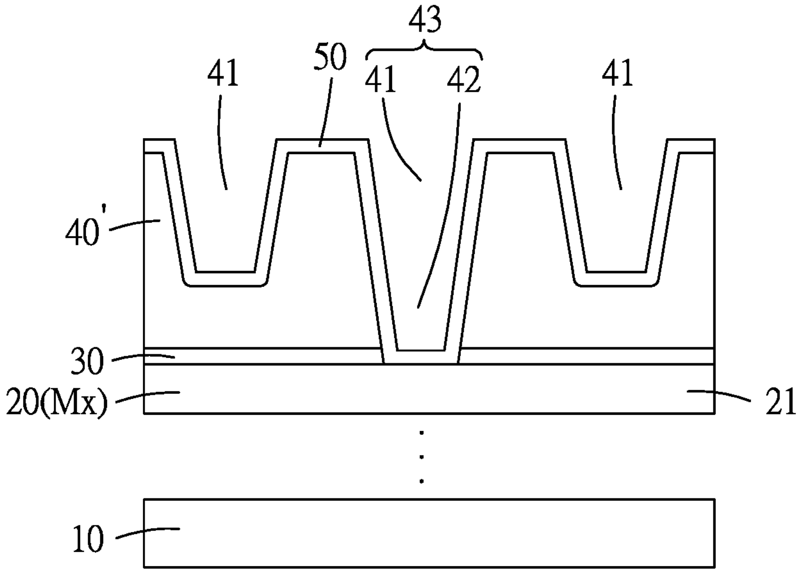

Referring to FIG. 1 and the example illustrated in FIG. 7, in some embodiments, when the dielectric layer 40 is patterned in step S02, a portion of the etch stop layer 30 corresponding to the integrated recess 43 is also removed to expose a portion of a corresponding one of the conductive lines 21 of the conductive line layer 20 through the integrated recess 43. Therefore, referring to FIG. 1 and the example illustrated in FIG. 8, in step S03, the blocking material layer 50 thus formed covers the patterned dielectric layer 40' and the portion of the corresponding one of the conductive lines 21 of the conductive line layer 20. Referring to FIG. 1 and the example illustrated in FIG. 9, in step S04, in which the blocking dielectric layer 50' is formed, the second blocking dielectric portion 52 further extends downwardly through the etch stop layer 30 so as to terminate at the corresponding one of the conductive lines 21 of the conductive line layer 20. Therefore, referring to the example illustrated in FIG. 10, in the interconnect layer 80 of the semiconductor device, the second blocking dielectric portion 52 fully covers the wall part 621 of the second barrier liner portion 62.

Figure 9:
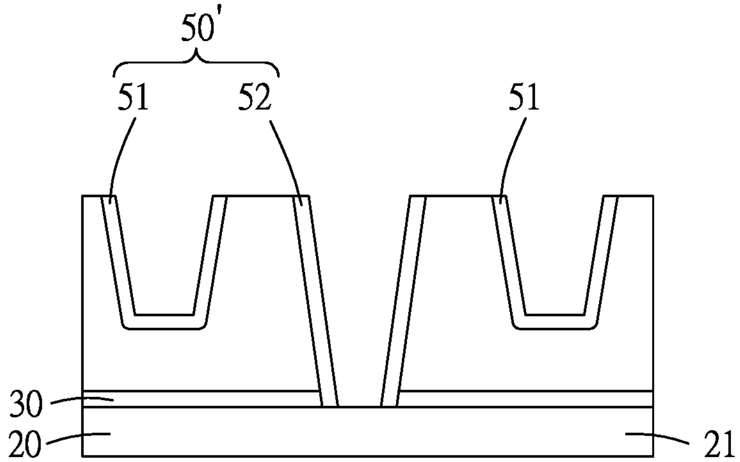

In some embodiments, the blocking dielectric layer 50' of the structure shown in FIG. 9 may be formed by depositing the blocking dielectric material directly on the sidewall 411 and the bottom 412 of the first recesses 41, the sidewall 431 of the integrated recess 43, and an exposed lateral surface of the etch stop layer 30 (see FIG. 7) using a selective deposition process, for example, but not limited to, selective PVD, selective CVD, selective PECVD, selective ALD, selective PEALD, or combinations thereof.

Figure 11:
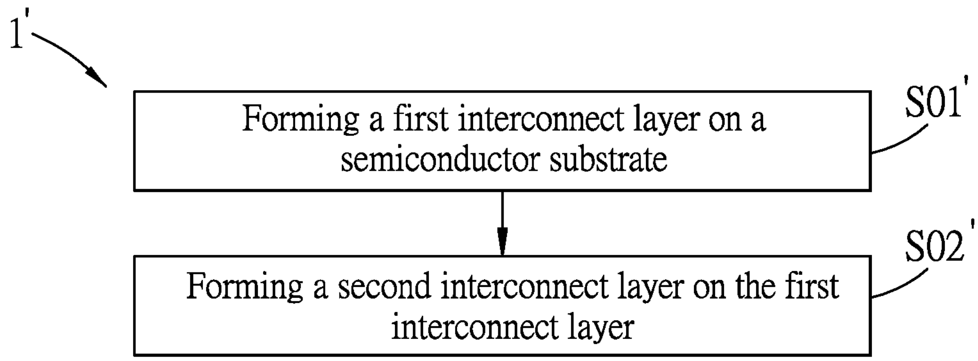
FIG. 11 is a flow diagram illustrating a method for manufacturing a semiconductor device in accordance with some embodiments, in which a single damascene process is used.
Figure 12:
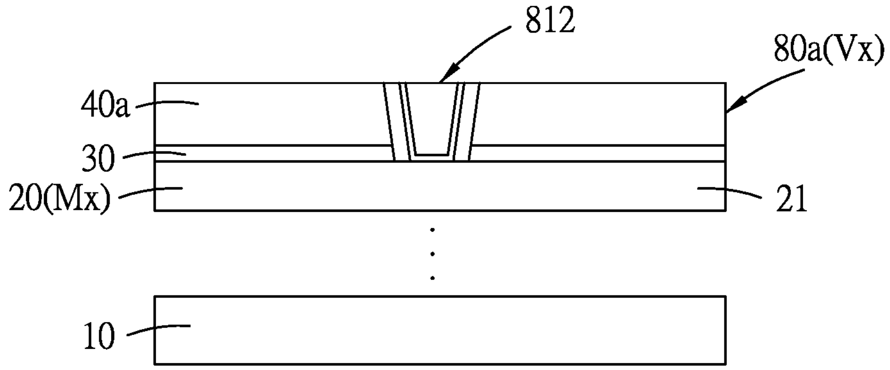
FIGS. 12 and 13 illustrate schematic views of some intermediate stages of the method depicted in FIG. 11 in accordance with some embodiments.
Figure 13:
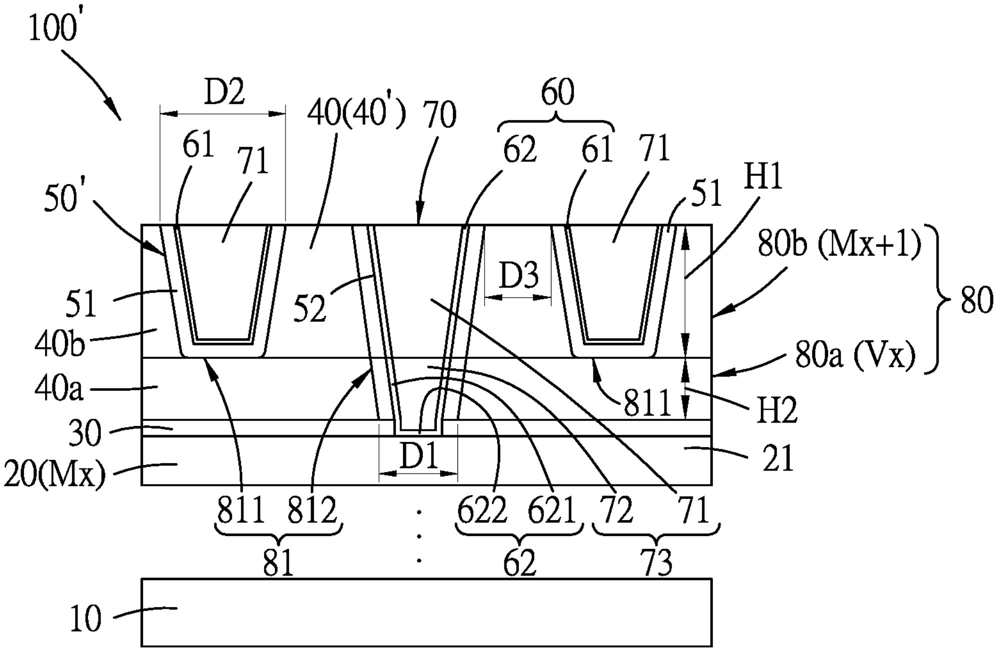

FIG. 11 is a flow diagram illustrating a method 1' for manufacturing a semiconductor device (for example, the semiconductor device 100' shown in FIGS. 13 and 14) in accordance with some embodiments, in which a single damascene process is used for manufacturing an interconnect structure of the semiconductor device 100'. FIGS. 12 and 13 illustrate schematic views of some intermediate stages of the method 1' in accordance with some embodiments. Additional steps can be provided before, after or during the method 1, and some of the steps described herein may be replaced by other steps or be eliminated. Similarly, further additional features may be present in the semiconductor device 100, and/or features present may be replaced or eliminated in additional embodiments.

Referring to FIG. 11 and the example illustrated in FIG. 12, the method 1' begins at step S01', where a first interconnect layer **80*a* (for example, a conductive via layer (Vx)) is formed on the conductive line layer 20 disposed on the semiconductor substrate 10. The first interconnect layer 80*a* may be formed by forming a layer of the high thermal conductive dielectric material described above on the etch stop layer 30, patterning the layer of the high thermal conductive dielectric material to form a recess therein, and forming the second feature 812 in the recess of the layer of the high thermal conductive dielectric material by a single damascene process, which is similar to the process for forming the interconnect structure 80**.

Referring to FIG. 11 and the example illustrated in FIG. 13, the method 1' proceeds to step S02', where a second interconnect layer 80*b* (for example, a conductive line layer ($M_{x+1}$)) is formed on the first interconnect layer 80*a*. The second interconnect layer 80*b* may be formed by forming a layer of the high thermal conductive dielectric material described above on the first interconnect layer 80*a*, patterning the layer of the high thermal conductive dielectric material to form a plurality of recesses therein, one of which is aligned with the second feature 812, and forming the first features 811 in the recesses of the layer of the high thermal conductive dielectric material, respectively, by a single damascene process, which is similar to the process for forming the interconnect structure 80, so as to form the second interconnect layer 80*b*, in which one of the first features 811 is aligned with and connected to the second feature 812.

Figure 10:
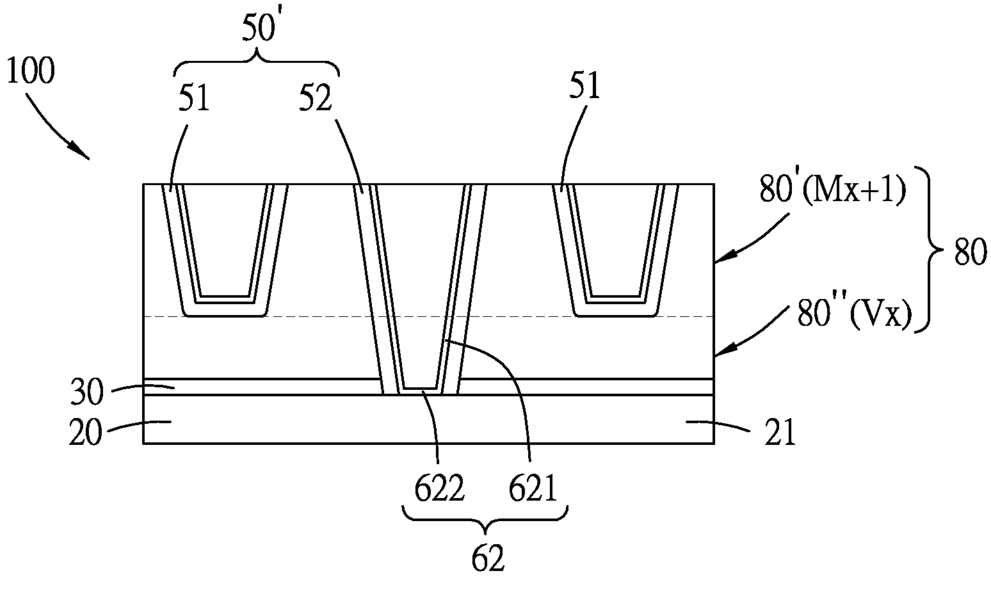
Figure 14:
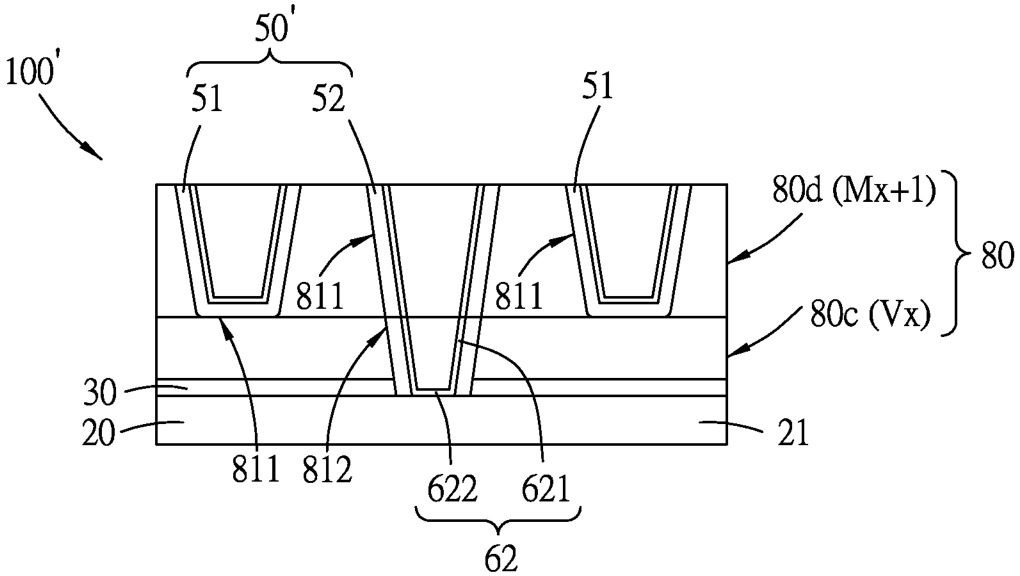
FIG. 14 illustrates a schematic view of a semiconductor device in accordance with some embodiments, in which a single damascene process is used for separately forming a plurality of conductive lines and a conductive via.

Similarly, referring to the example illustrated in FIG. 14, which is similar to the example illustrated in FIG. 10, a first interconnect layer 80*c* (for example, a conductive via layer (Vx)) including the second feature 812 is formed on the conductive line layer 20 by a single damascene process. Thereafter, a second interconnect layer 80*d* (for example, a conductive line layer ($M_{x+1}$)) including the first features 811 is formed on the first interconnect layer 80*c*. One of the first features 811 is aligned with and connected to the second feature 812.

In a semiconductor device of the present disclosure, a dielectric layer made of a high thermal conductive dielectric material having a thermal conductivity greater than about 10 W/mK serves as a heat dissipation layer of an interconnect layer, so that heat produced from, for example, but not limited to, a conductive interconnect structure can be dissipated efficiently. In addition, a blocking dielectric layer is disposed in the dielectric layer to isolate the conductive interconnect structure from the dielectric layer and to isolate conductive features of the conductive interconnect structure from one another. Therefore, current leakage among the conductive features through the dielectric layer 40 can be avoided.

In accordance with some embodiments of the present disclosure, a semiconductor device includes a substrate, a heat dissipation dielectric layer, a conductive interconnect structure, and a blocking dielectric layer. The heat dissipation dielectric layer is disposed on the substrate and has a thermal conductivity greater than 10 W/mK. The conductive interconnect structure is disposed in the heat dissipation dielectric layer. The blocking dielectric layer is disposed in the heat dissipation dielectric layer to isolate the conductive interconnect structure from the heat dissipation dielectric layer.

In accordance with some embodiments of the present disclosure, the heat dissipation dielectric layer includes a thermal conductive dielectric material, which includes boron arsenide, beryllium oxide, hexagonal boron nitride, diamond, graphene, graphite, silicon nitride, silicon carbide, aluminum oxide, aluminum nitride, magnesium oxide, silicon oxide, sapphire, zirconium oxide, bismuth oxide, titanium oxide, gallium oxide, gallium arsenide, gallium nitride, β-carbon nitride, indium antimonide, boron carbide, hafnium oxide, or combinations thereof.

In accordance with some embodiments of the present disclosure, the blocking dielectric layer includes a blocking dielectric material, which includes boron arsenide, beryllium oxide, hexagonal boron nitride, diamond, graphene, graphite, silicon nitride, silicon carbide, aluminum oxide, aluminum nitride, magnesium oxide, silicon oxide, sapphire, zirconium oxide, bismuth oxide, titanium oxide, gallium oxide, gallium arsenide, gallium nitride, β-carbon nitride, indium antimonide, boron carbide, hafnium oxide, silicon carbonitride, aluminum oxynitride, or combinations thereof.

In accordance with some embodiments of the present disclosure, the conductive interconnect structure includes at least one conductive feature having a sidewall, and the blocking dielectric layer includes at least one blocking dielectric portion covering the sidewall of the at least one conductive feature.

In accordance with some embodiments of the present disclosure, the at least one conductive feature further has a bottom connected to the sidewall, and the at least one blocking dielectric portion further covers the bottom of the at least one conductive feature.

In accordance with some embodiments of the present disclosure, the side wall of the at least one conductive feature is partially covered by the at least one blocking dielectric portion.

In accordance with some embodiments of the present disclosure, the side wall of the at least one conductive feature is fully covered by the at least one blocking dielectric portion.

In accordance with some embodiments of the present disclosure, the conductive interconnect structure includes a plurality of first conductive features and a second conductive feature connected to a corresponding one of the first conductive features to form an integrated conductive feature having a sidewall. Each of the first conductive features other than the corresponding one of the first conductive features connected to the second conductive feature have a sidewall and a bottom connected to the sidewall. The blocking dielectric layer includes a first blocking dielectric portion and a second blocking dielectric portion. The first blocking dielectric portion covers the sidewall and the bottom of each of the first conductive features other than the corresponding one of the first conductive features connected to the second conductive feature. The second blocking dielectric portion covers the sidewall of the integrated conductive feature.

In accordance with some embodiments of the present disclosure, the sidewall of the integrated conductive feature is partially covered by the second blocking dielectric portion.

In accordance with some embodiments of the present disclosure, the sidewall of the integrated conductive feature is fully covered by the second blocking dielectric portion.

In accordance with some embodiments of the present disclosure, a semiconductor device includes a substrate, an etch stop layer, a heat dissipation dielectric layer, a conductive interconnect structure, and a blocking dielectric layer. The etch stop layer is disposed on the substrate. The heat dissipation dielectric layer is disposed on the etch stop layer opposite to the substrate, and has a thermal conductivity greater than 10 W/mK. The conductive interconnect structure is disposed in the heat dissipation dielectric layer. The blocking dielectric layer is disposed in the heat dissipation dielectric layer to isolate the conductive interconnect structure from the heat dissipation dielectric layer.

In accordance with some embodiments of the present disclosure, the heat dissipation dielectric layer includes a thermal conductive dielectric material, which includes boron arsenide, beryllium oxide, hexagonal boron nitride, diamond, graphene, graphite, silicon nitride, silicon carbide, aluminum oxide, aluminum nitride, magnesium oxide, silicon oxide, sapphire, zirconium oxide, bismuth oxide, titanium oxide, gallium oxide, gallium arsenide, gallium nitride, β-carbon nitride, indium antimonide, boron carbide, hafnium oxide, or combinations thereof. The blocking dielectric layer includes a blocking dielectric material, which includes boron arsenide, beryllium oxide, hexagonal boron nitride, diamond, graphene, graphite, silicon nitride, silicon carbide, aluminum oxide, aluminum nitride, magnesium oxide, silicon oxide, sapphire, zirconium oxide, bismuth oxide, titanium oxide, gallium oxide, gallium arsenide, gallium nitride, β-carbon nitride, indium antimonide, boron carbide, hafnium oxide, silicon carbonitride, aluminum oxynitride, or combinations thereof.

In accordance with some embodiments of the present disclosure, the conductive interconnect structure includes at least one conductive feature having a sidewall, and the blocking dielectric layer includes at least one blocking dielectric portion covering the sidewall of the at least one conductive feature.

In accordance with some embodiments of the present disclosure, the at least one blocking dielectric portion extends to terminate at the etch stop layer so as to partially cover the sidewall of the at least one conductive feature.

In accordance with some embodiments of the present disclosure, the at least one blocking dielectric portion extends through the etch stop layer so as to fully cover the sidewall of the at least one conductive feature.

In accordance with some embodiments of the present disclosure, the conductive interconnect structure includes a plurality of first conductive features and a second conductive feature connected to a corresponding one of the first conductive features to form an integrated conductive feature having a sidewall. Each of the first conductive features other than the corresponding one of the first conductive features connected to the second conductive feature has a sidewall and a bottom connected to the sidewall. The blocking dielectric layer includes a first blocking dielectric portion and a second blocking dielectric portion. The first blocking dielectric portion covers the sidewall and the bottom of each of the first conductive features other than the corresponding one of the first conductive features connected to the second conductive feature. The second blocking dielectric portion extends to terminate at the etch stop layer so as to partially cover the sidewall of the integrated conductive feature.

In accordance with some embodiments of the present disclosure, the conductive interconnect structure includes a plurality of first conductive features and a second conductive feature connected to a corresponding one of the first conductive features to form an integrated conductive feature having a sidewall. Each of the first conductive features other than the corresponding one of the first conductive features connected to the second conductive feature has a sidewall and a bottom connected to the sidewall. The blocking dielectric layer includes a first blocking dielectric portion and a second blocking dielectric portion. The first blocking dielectric portion covers the sidewall and the bottom of each of the first conductive features other than the corresponding one of the first conductive features connected to the second conductive feature. The second blocking dielectric portion extends through the etch stop layer so as to fully cover the sidewall of the integrated conductive feature.

In accordance with some embodiments of the present disclosure, a method for manufacturing a semiconductor device includes: forming a first patterned dielectric layer on a substrate, the first patterned dielectric layer being formed with a first recess and having a thermal conductivity greater than 10 W/mK; forming a first feature in the first recess, the first feature including a first conductive feature and a layer of a first blocking dielectric material laterally covering the first conductive feature; forming a second patterned dielectric layer on the first patterned dielectric layer, the second patterned dielectric layer being formed with a plurality of second recesses, one of which is formed on the first feature, the second patterned dielectric layer having a thermal conductivity greater than 10 W/mK; and forming a plurality of second features in the second recesses, respectively, each of the second feature including a second conductive feature and a layer of a second blocking dielectric material laterally covering the second conductive feature.

In accordance with some embodiments of the present disclosure, each of the first patterned dielectric layer and the second patterned dielectric layer independently includes a thermal conductive dielectric material selected from boron arsenide, beryllium oxide, hexagonal boron nitride, diamond, graphene, graphite, silicon nitride, silicon carbide, aluminum oxide, aluminum nitride, magnesium oxide, silicon oxide, sapphire, zirconium oxide, bismuth oxide, titanium oxide, gallium oxide, gallium arsenide, gallium nitride, β-carbon nitride, indium antimonide, boron carbide, hafnium oxide, and combinations thereof. Each of the first blocking dielectric material and the second blocking dielectric material is independently selected from boron arsenide, beryllium oxide, hexagonal boron nitride, diamond, graphene, graphite, silicon nitride, silicon carbide, aluminum oxide, aluminum nitride, magnesium oxide, silicon oxide, sapphire, zirconium oxide, bismuth oxide, titanium oxide, gallium oxide, gallium arsenide, gallium nitride, β-carbon nitride, indium antimonide, boron carbide, hafnium oxide, silicon carbonitride, aluminum oxynitride, and combinations thereof.

In accordance with some embodiments of the present disclosure, the first patterned dielectric layer and the second patterned dielectric layer are formed integrally at the same time. The first recess is disposed below and in spatial communication with a corresponding one of the second recesses. The first feature and the second features are formed at the same time.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

a substrate;

a heat dissipation dielectric layer disposed on the substrate, the heat dissipation dielectric layer having a thermal conductivity greater than 10 W/mK;

a conductive interconnect structure disposed in the heat dissipation dielectric layer; and a blocking dielectric layer disposed in the heat dissipation dielectric layer to isolate the conductive interconnect structure from the heat dissipation dielectric layer, wherein the heat dissipation dielectric layer has an upper surface distal from the substrate, the conductive interconnect structure has an upper end surface distal from the substrate, and the upper surface of the heat dissipation dielectric layer is flush with the upper end surface of the conductive interconnect structure.

2. The semiconductor device as claimed in claim 1, wherein the heat dissipation dielectric layer includes a thermal conductive dielectric material including boron arsenide, beryllium oxide, hexagonal boron nitride, diamond, graphene, graphite, silicon nitride, silicon carbide, aluminum oxide, aluminum nitride, magnesium oxide, silicon oxide, sapphire, zirconium oxide, bismuth oxide, titanium oxide, gallium oxide, gallium arsenide, gallium nitride, β-carbon nitride, indium antimonide, boron carbide, hafnium oxide, or combinations thereof.

3. The semiconductor device as claimed in claim 1, wherein the blocking dielectric layer includes a blocking dielectric material including boron arsenide, beryllium oxide, hexagonal boron nitride, diamond, graphene, graphite, silicon nitride, silicon carbide, aluminum oxide, aluminum nitride, magnesium oxide, silicon oxide, sapphire, zirconium oxide, bismuth oxide, titanium oxide, gallium oxide, gallium arsenide, gallium nitride, β-carbon nitride, indium antimonide, boron carbide, hafnium oxide, silicon carbonitride, aluminum oxynitride, or combinations thereof.

4. The semiconductor device as claimed in claim 1, wherein the conductive interconnect structure includes at least one conductive feature having a sidewall, and the blocking dielectric layer includes at least one blocking dielectric portion covering the sidewall of the at least one conductive feature.

5. The semiconductor device as claimed in claim 4, wherein the at least one conductive feature further has a bottom connected to the sidewall, and the at least one blocking dielectric portion further covers the bottom of the at least one conductive feature.

6. The semiconductor device as claimed in claim 4, wherein the side wall of the at least one conductive feature is partially covered by the at least one blocking dielectric portion.

7. The semiconductor device as claimed in claim 4, wherein the side wall of the at least one conductive feature is fully covered by the at least one blocking dielectric portion.

8. The semiconductor device as claimed in claim 1, wherein the conductive interconnect structure includes a plurality of first conductive features and a second conductive feature connected to a corresponding one of the plurality of first conductive features to form an integrated conductive feature having a sidewall, each of the plurality of first conductive features other than the corresponding one of the plurality of first conductive features connected to the second conductive feature having a sidewall and a bottom connected to the sidewall; and the blocking dielectric layer includes a first blocking dielectric portion and a second blocking dielectric portion, the first blocking dielectric portion covering the sidewall and the bottom of each of the plurality of first conductive features other than the corresponding one of the plurality of first conductive features connected to the second conductive feature, the second blocking dielectric portion covering the sidewall of the integrated conductive feature.

9. The semiconductor device as claimed in claim 8, wherein the sidewall of the integrated conductive feature is partially covered by the second blocking dielectric portion.

10. The semiconductor device as claimed in claim 8, wherein the sidewall of the integrated conductive feature is fully covered by the second blocking dielectric portion.

11. A semiconductor device, comprising:

a substrate;

an etch stop layer disposed on the substrate;

a heat dissipation dielectric layer disposed on the etch stop layer opposite to the substrate, the heat dissipation dielectric layer having a thermal conductivity greater than 10 W/mK;

a conductive interconnect structure disposed in the heat dissipation dielectric layer; and a blocking dielectric layer disposed in the heat dissipation dielectric layer to isolate the conductive interconnect structure from the heat dissipation dielectric layer, wherein the heat dissipation dielectric layer has an upper surface distal from the substrate, the blocking dielectric layer has an upper end surface distal from the substrate, and the upper surface of the heat dissipation dielectric layer is flush with the upper end surface of the blocking dielectric layer.

12. The semiconductor device as claimed in claim 11, wherein the heat dissipation dielectric layer includes a thermal conductive dielectric material; and the blocking dielectric layer includes a blocking dielectric material which includes elements the same as elements of the thermal conductive dielectric material, contents of the elements included in the blocking dielectric material being different from contents of the elements included in the thermal conductive dielectric material.

13. The semiconductor device as claimed in claim 11, wherein the conductive interconnect structure includes at least one conductive feature having a sidewall, and the blocking dielectric layer includes at least one blocking dielectric portion covering the sidewall of the at least one conductive feature.

14. The semiconductor device as claimed in claim 13, wherein the at least one blocking dielectric portion extends to terminate at the etch stop layer so as to partially cover the sidewall of the at least one conductive feature.

15. The semiconductor device as claimed in claim 13, wherein the at least one blocking dielectric portion extends through the etch stop layer so as to fully cover the sidewall of the at least one conductive feature.

16. The semiconductor device as claimed in claim 11, wherein the conductive interconnect structure includes a plurality of first conductive features and a second conductive feature connected to a corresponding one of the plurality of first conductive features to form an integrated conductive feature having a sidewall, each of the plurality of first conductive features other than the corresponding one of the plurality of first conductive features connected to the second conductive feature having a sidewall and a bottom connected to the sidewall; and the blocking dielectric layer includes a first blocking dielectric portion and a second blocking dielectric portion, the first blocking dielectric portion covering the sidewall and the bottom of each of the plurality of first conductive features other than the corresponding one of the plurality of first conductive features connected to the second conductive feature, the second blocking dielectric portion extending to terminate at the etch stop layer so as to partially cover the sidewall of the integrated conductive feature.

17. The semiconductor device as claimed in claim 11, wherein the conductive interconnect structure includes a plurality of first conductive features and a second conductive feature connected to a corresponding one of the plurality of first conductive features to form an integrated conductive feature having a sidewall, each of the plurality of first conductive features other than the corresponding one of the plurality of first conductive features connected to the second conductive feature having a sidewall and a bottom connected to the sidewall; and the blocking dielectric layer includes a first blocking dielectric portion and a second blocking dielectric portion, the first blocking dielectric portion covering the sidewall and the bottom of each of the plurality of first conductive features other than the corresponding one of the plurality of first conductive features connected to the second conductive feature, the second blocking dielectric portion extending through the etch stop layer so as to fully cover the sidewall of the integrated conductive feature.

18. A semiconductor device, comprising:

a substrate;

an etch stop layer disposed on the substrate;

a heat dissipation dielectric layer disposed on the etch stop layer opposite to the substrate, the heat dissipation dielectric layer having a thermal conductivity greater than 10 W/mK;

a conductive interconnect structure disposed in the heat dissipation dielectric layer and extending into the etch stop layer; and a blocking dielectric layer disposed in the heat dissipation dielectric layer to isolate the conductive interconnect structure from the heat dissipation dielectric layer, wherein the conductive interconnect structure has an upper end surface distal from the substrate, the blocking dielectric layer has an upper end surface distal from the substrate, and the upper end surface of the conductive interconnect structure is flush with the upper end surface of the blocking dielectric layer.

19. The semiconductor device as claimed in claim 18, wherein the conductive interconnect structure includes a plurality of first conductive features and a second conductive feature connected to a corresponding one of the plurality of first conductive features to form an integrated conductive feature having a sidewall; and the blocking dielectric layer includes a blocking dielectric portion which laterally covers the integrated conductive feature, and which includes a first blocking dielectric part interfacing the heat dissipation dielectric layer.

20. The semiconductor device as claimed in claim 19, wherein the blocking dielectric portion further includes a second blocking dielectric part integrated with the first blocking dielectric part and interfacing the etch stop layer.

* * * * *